United States Patent [19]
Hancock

[11] Patent Number: 5,488,296
[45] Date of Patent: Jan. 30, 1996

[54] TEMPERATURE COMPENSATED MAGNETICALLY SENSITIVE CIRCUIT

[75] Inventor: Peter G. Hancock, Plano, Tex.

[73] Assignee: Honeywell Inc., Minneapolis, Minn.

[21] Appl. No.: 378,294

[22] Filed: Jan. 25, 1995

[51] Int. Cl.$^6$ .......................... G01R 33/07; H01L 43/06; H03K 17/90
[52] U.S. Cl. ..................... 324/251; 324/207.12; 324/225; 327/511; 327/513
[58] Field of Search .......................... 324/207.12, 207.2, 324/207.21, 225, 235, 251, 252, 173, 174, 117 H; 327/511–513; 338/32 H; 323/294, 368

[56] References Cited

U.S. PATENT DOCUMENTS

| | | | |
|---|---|---|---|
| 4,134,030 | 1/1979 | Pace | 327/511 |
| 4,449,081 | 5/1984 | Doemen | 324/117 H X |
| 4,521,727 | 6/1985 | Atherton et al. | 327/511 X |
| 4,646,014 | 2/1987 | Eulenberg | 324/251 |
| 4,857,842 | 8/1989 | Sturman et al. | 324/207.12 X |
| 4,914,387 | 4/1990 | Santos | 324/251 X |
| 5,055,768 | 10/1991 | Plagens | 324/225 X |
| 5,231,351 | 7/1993 | Kordts et al. | 324/207.12 X |

FOREIGN PATENT DOCUMENTS 1629887  2/1991  U.S.S.R. ................................ 324/251

OTHER PUBLICATIONS

Digital Gaussmeter Model 660, Bell Inc. Brochure. Form No. DIG566.

Primary Examiner—Gerard R. Strecker
Attorney, Agent, or Firm—William D. Lanyi

[57] ABSTRACT

A magnetic detection circuit is provided which creates a reference signal that varies with temperature in a manner that is generally identical to the temperature induced variation of a Hall element. By providing a temperature sensitive reference signal, the Hall output signal can be compared to the reference signal without errors being induced by temperature change. One embodiment of the present invention provides a first resistor connected in parallel with the diode which, in turn, is connected between a Hall cell and a point of ground potential. Another embodiment of the present invention comprises a second resistor that is connected in series with the first resistor and in parallel with the Hall cell. Another embodiment of the present invention also incorporates a temperature sensitive resistor that is made of the same material as the Hall cell and used in conjunction with a trimmable resistor to provide inputs to an operational amplifier.

17 Claims, 6 Drawing Sheets

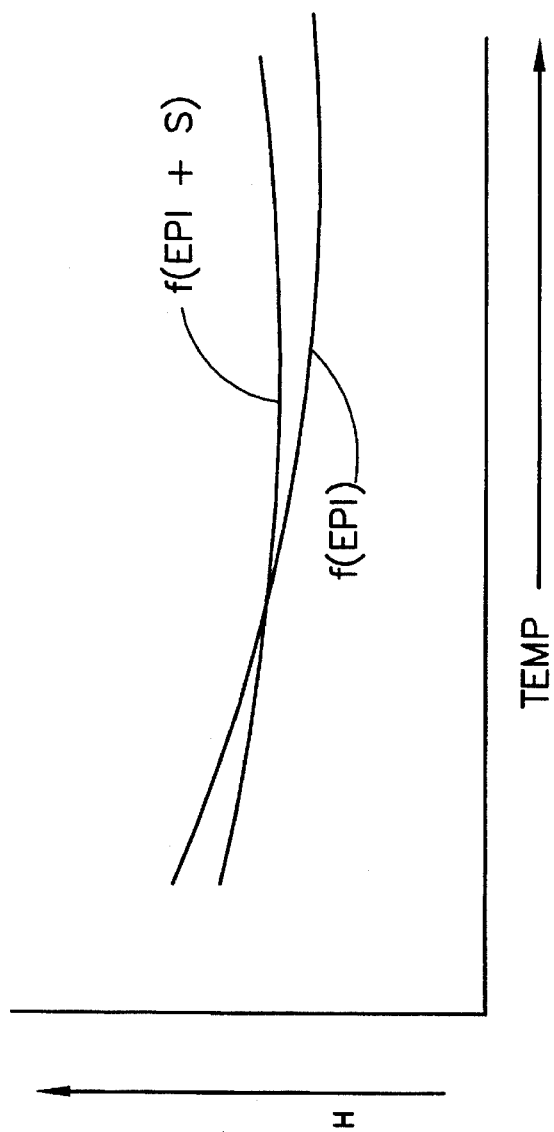
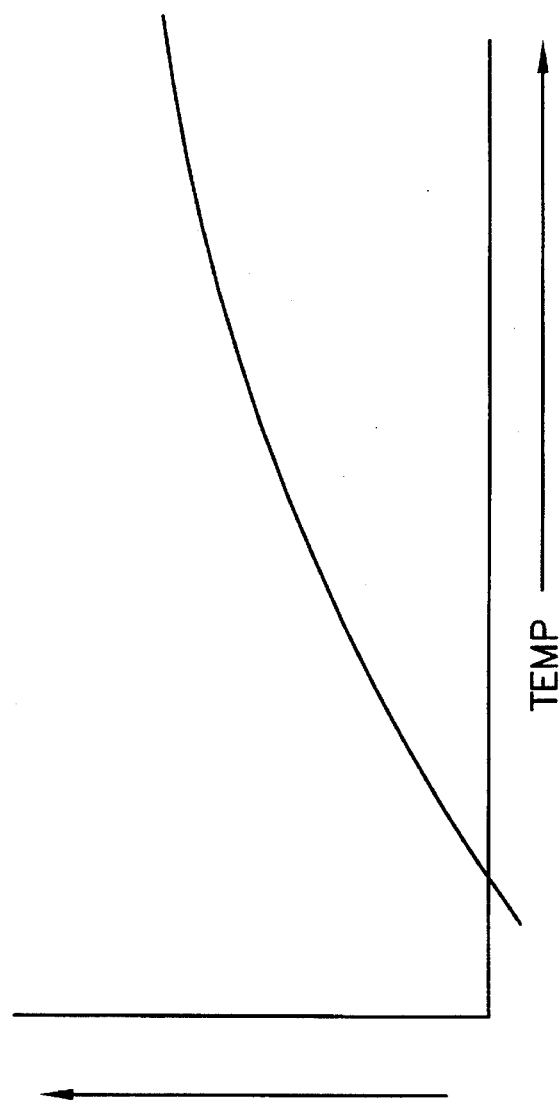

5,488,296

1

TEMPERATURE COMPENSATED MAGNETICALLY SENSITIVE CIRCUIT

BACKGROUND OF THE INVENTION

1. Field of the Invention

The present invention is generally related to a magnetically sensitive circuit and, more particularly, to a circuit which provides a reference signal that varies as a function of temperature in a manner that is similar to that of a magnetically sensitive component.

2. Description of the Prior Art

Those skilled in the art are familiar with many types of magnetically sensitive circuits. One type of magnetically sensitive circuit utilizes a Hall effect element that provides an output signal that is representative of the magnetic field component which is perpendicular to the plane of the Hall element. The material which is used to provide the Hall cell is typically temperature sensitive and its output can vary by approximately 700 parts per million per degree centigrade. In magnetic sensing circuits, it is also typical to provide a reference signal that is compared with the Hall output voltage in order to provide a digital output which represents the relative magnitude of the Hall output voltage and the reference signal. If the reference signal is not temperature sensitive in a manner similar to the Hall output signal, the integrity of the digital output signal can be deleteriously affected. It would therefore be advantageous if a means were provided to cause the reference signal to change as a function of temperature in a manner that is generally identical to the temperature induced change in the Hall output signal.

SUMMARY OF THE INVENTION

The present invention provides a magnetic sensing circuit that comprises a magnetically sensitive device, such as a Hall effect element. In addition, it comprises a first means for providing an output signal that is representative of the strength of a magnetic field in a predetermined direction relative to the magnetically sensitive device. In the embodiments of the present invention which incorporate a Hall effect element, the strength of a magnetic field that is generally perpendicular to the Hall plane is sensed and a first means is incorporated for providing an output signal from the Hall element. The present invention also comprises a second means for providing a reference signal and a means for comparing the output signal from the Hall element to the reference signal. The second providing means comprises a means for causing the reference signal to change as a function of temperature in a manner similar to the output signal.

In a particularly preferred embodiment of the present invention, a diode is connected in series with the magnetically sensitive device between a power source and a point of ground potential. The causing means comprises a first resistor connected in parallel with the diode. In one embodiment of the present invention, the causing means further comprises a second resistor connected in parallel with the magnetically sensitive device. The causing means comprises a first transistor having its base connected to said diode with said diode being connected between the base and the point of ground potential. The first transistor is connected between a trimmable resistor and the point of ground potential.

2

In a preferred embodiment of the present invention, the circuit comprises an operational amplifier having a first input connected to a circuit point between the trimmable resistor and the first transistor. In addition, a temperature sensitive resistor is connected between the power source and a second input of the operational amplifier.

A preferred embodiment of the present invention further comprises a second transistor having its emitter connected to the temperature sensitive resistor. The collector of the second transistor provides a reference signal that varies, as a function of temperature, in a manner that is similar to the temperature induced variation in the Hall output signal. The temperature sensitive resistor is selected to have a temperature coefficient similar to that of the magnetically sensitive device, or Hall effect element. The reference signal provided by the present invention can be a reference current or a reference voltage.

BRIEF DESCRIPTION OF THE DRAWINGS

The present invention will be more fully understood from a reading of the Description of the Preferred Embodiment in conjunction with the drawings, in which:

FIGS. 2A and 2B show the effects on the Hall current and the scatter coefficient as a function of temperature;

DESCRIPTION OF THE PREFERRED EMBODIMENT

Figure 1:
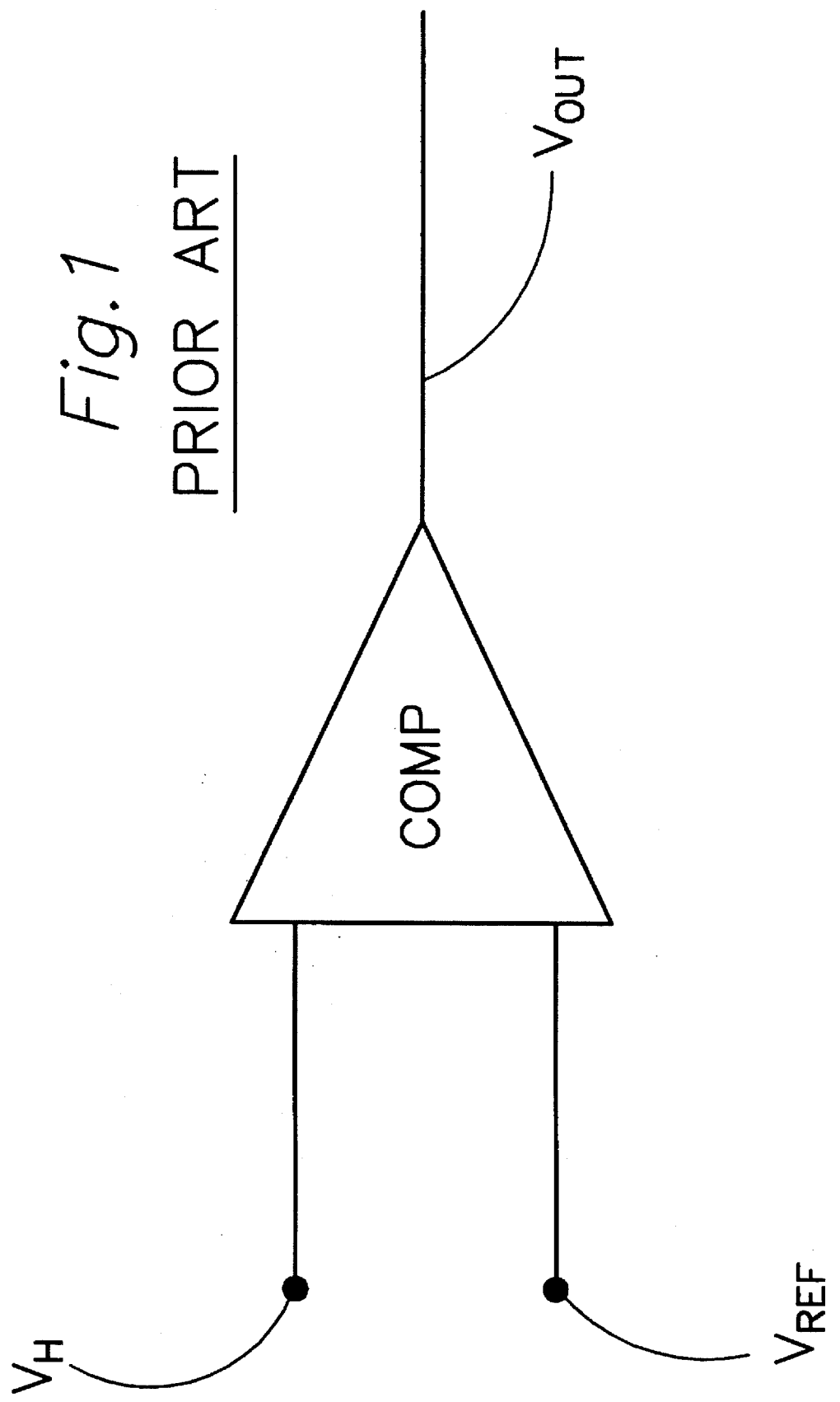
FIG. 1 illustrates a known means for comparing a Hall output voltage with a reference signal to provide a digital output signal.

Throughout the Description of the Preferred Embodiment, like components will be identified by like reference numerals. FIG. 1 illustrates a known means for providing a digital output signal $V_{OUT}$ that is a function of the relative magnitudes of a Hall voltage $V_H$ and a reference voltage $V_{REF}$. The output voltage $V_{OUT}$ is digital and is positive when the Hall voltage exceeds the reference voltage. One problem that is commonly encountered in magnetic circuits that utilize Hall effect elements is that the Hall voltage $V_H$ is temperature sensitive because of the composition of the Hall element. On the other hand, the reference voltage $V_{REF}$ is generally not temperature sensitive. Because of this discrepancy, temperature changes can cause variations in the Hall voltage $V_H$. As a result the device of FIG. 1 provides high digital signals $V_{OUT}$ at points other than where they would occur under conditions of stable temperature.

FIG. 2A graphically illustrates the variation in the Hall current caused by the temperature induced changes in the epitaxial layer of an integrated circuit and, in addition, changes caused by both the temperature induced variations of the epitaxial layer and the temperature induced changes in the scatter coefficient of the Hall cell. Changes in the epitaxial layer, as a function of temperature, are typically compensated by methods that are generally known to those skilled in the art. However, with reference to FIGS. 2A and 2B, it can be seen that an additional scatter coefficient S temperature induced change must also be compensated in order to remove the temperature sensitivity of the comparison made between the Hall voltage VH and the reference voltage $V_{REF}$ as described above in conjunction with FIG. 1.

Figure 3:
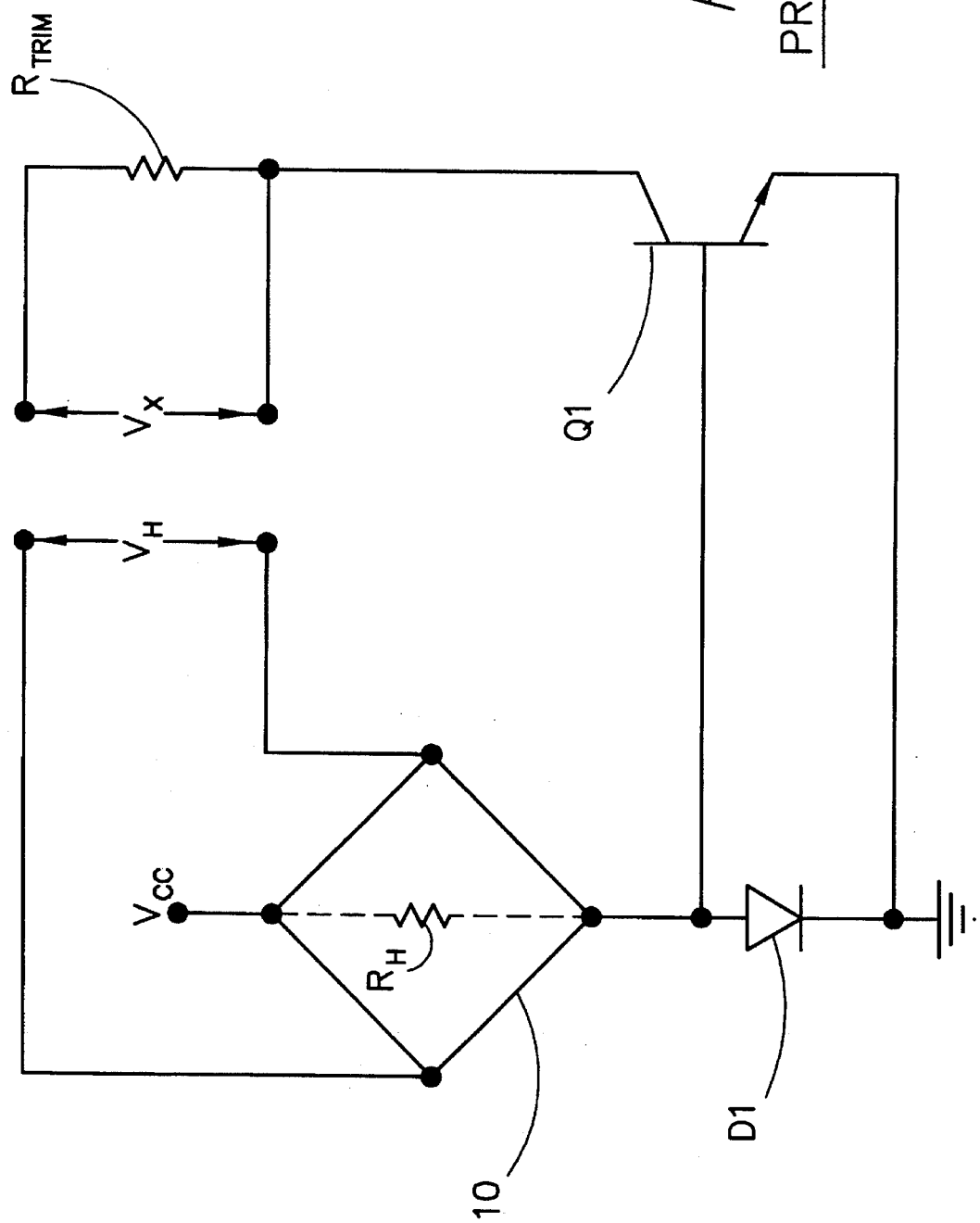
FIG. 3 shows a generally known way of connecting a Hall cell in a current mirror circuit.

FIG. 3 illustrates a typical circuit that is generally known to those skilled in the art. A Hall element 10 is provided with a reference current passing through the Hall element 10 between a voltage source $V_{CC}$ and a point of ground potential. A Hall output voltage $V_H$ can be measured in a manner that is generally known to those skilled in the art. Changes in the Hall output voltage $V_H$ represent changes in the strength of the magnetic field component perpendicular to the plane of the Hall element. The resistance of the Hall element is represented by $R_H$. In order to provide a threshold magnitude that can be used as a reference voltage, a current mirror arrangement such as that shown in FIG. 3 is commonly provided. A trimmable resistor $R_{TRIM}$ is connected as shown in FIG. 3 and a transistor Q1 is arranged to provide a collector current which is a known fraction of the Hall current.

The Hall output $V_H$ is defined as shown in equation 1.

$$V_H = K_1 K_2 I_H B_N (1 + S\Delta T) \quad (1)$$

The Hall voltage, as shown above, is defined as the product of a first constant $K_1$, which is a geometrical constant, $K_2$ and S which reflect the ratio between the Hall mobility and drift mobility. $B_N$ is the component of a magnetic field that is perpendicular to the plane of the Hall element. The parenthetical expression in equation 1 reflects the change in the Hall output signal as a function of temperature change $\Delta T$ and a scatter coefficient which can typically be approximately 700 parts per million per degree C. As shown below in equations 2 and 3, the temperature effect on the Hall output voltage is a function of the temperature magnitude above 25 degrees C.

$$\Delta T = T - T_0 \quad (2)$$

$$T_0 = 25° C. \quad (3)$$

The circuit illustrated in FIG. 3 is often used to create a reference voltage or current in order to provide thresholds which can be used as references for comparisons of the Hall voltage. These reference signals can be used to provide trip points that permit the digital circuit shown in FIG. 1 to operate. The references can also be used to remove a DC component in $V_H$ or $B_N$ by allowing greater amplification of relatively small signals that comprise DC bias levels. The circuit shown in FIG. 3 mirrors a fraction $K_3$ of the Hall current $I_H$ through a resistor $R_{TRIM}$ which is not temperature sensitive. The resistor $R_{TRIM}$ is trimmable and is altered so that the derived voltage $V_X$ at room temperature equals the Hall output $V_H$ at some preselected magnitude of magnetic field perpendicular to the Hall effect element. Equation 4 describes this relationship.

$$I_H K_3 R_{TRIM} = K_1 K_2 I_H B_0 \quad (4)$$

Therefore, at room temperature, equations 5–9 can be stated.

$$V_H = K_1 K_2 I_H B_N \quad (5)$$

$$V_X = K_3 I_H R_{TRIM} \quad (6)$$

$$K_3 R_{TRIM} = K_1 K_2 B_0 \quad (7)$$

$$V_H - V_X > 0 \text{ for } B_N > B_0 \quad (8)$$

$$V_H - V_X < 0 \text{ for } B_N < B_0 \quad (9)$$

Based on these relationships, the difference between the Hall voltage $V_a$ and the reference voltage $V_X$ can be used for various control or detection purposes. However, as shown above in equation 1, the parenthetical term which contains the scatter coefficient and the temperature change $\Delta T$ causes temperature errors of the order of approximately 7 percent per 100 degrees C. This type of error is generally not tolerable in precision magnetic sensing applications. It would therefore be beneficial if a reference current could be provided in the form shown in equation 10.

$$I_X = K I_H (1 + S\Delta T) \quad (10)$$

If a relationship similar to that shown in equation 10 could be provided, the effects of the Hall element scatter coefficient S could be compensated by providing a temperature sensitive reference $V_{REF}$ and the inherent temperature induced variations in the Hall output signal $V_H$ would therefore not cause errors in the digital output signal $V_{OUT}$ as described above in conjunction with FIG. 1.

Figure 4:
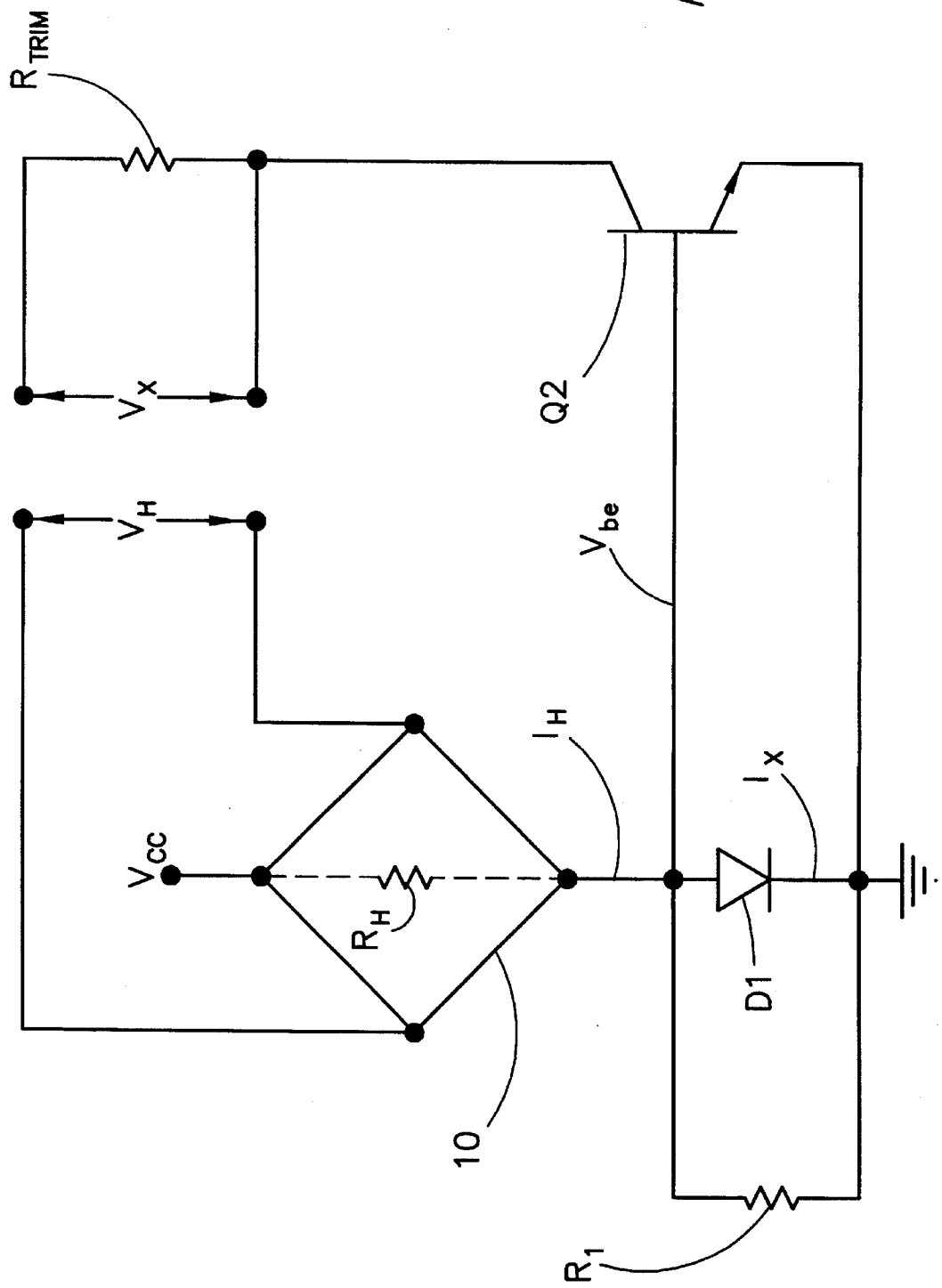
FIG. 4 shows one embodiment of the present invention.

FIG. 4 illustrates one embodiment of the present invention that incorporates a first resistor $R_1$ connected in parallel with the diode D1. The collector current of transistor Q2 is therefore a known fraction of the diode current $I_X$. In one embodiment of the present invention, the diode D1 can be a transistor with its collector and base connected to the base of transistor Q2 in FIG. 4 and its emitter connected to ground potential. Therefore, the sum of the currents through resistor $R_1$ and diode D1 equal the current $I_H$ flowing through the Hall effect element 10. This relationship is described by equation 11.

$$I_X = I_H - V_{be}/R_1 \quad (11)$$

The current $I_H$ flowing through the Hall element 10 is defined by equation 12.

$$I_H = (V_{CC} - V_{be})/R_H \quad (12)$$

$$T_X = T_H (1 - V_{be}/(I_H R_1)) \quad (13)$$

$$I_X = I_H (1 - (R_H/R_1)(V_{be}/(V_{CC} - V_{be}))) \quad (14)$$

Equations 13 and 14 define the current $I_X$ flowing through diode D1 in terms of the Hall current $I_H$, the Hall resistance $R_H$ and the resistance of the first resistor $R_1$. The relationship between the voltage $V_{be}$ across the base and emitter of the transistor Q2 is defined as shown in equation 15 where the condition shown in equation 16 is true.

$$V_{be} = V_{be0} + \alpha \Delta T \quad (15)$$

$$V_{be0} = V_{be} \text{ at } T = T_0 \quad (16)$$

$$I_X = I_H (1 - (R_H/R_1)(V_{be0} + \alpha \Delta T)/(V_{cc} - V_{be0} - \alpha \Delta T)) \quad (17)$$

As a result, the relationship between the current $I_X$ flowing through diode D1 and the Hall current $I_H$ can be described as shown in equation 18.

$$I_X/I_H \approx 1 - (R_H V_{be0}/R_1 (V_{CC} - V_{be0})) - (R_H \alpha \Delta T/R_1 (V_{CC} - V_{be0}))(1 + V_{be0}/(V_{CC} - V_{be0})) \quad (18)$$

In order to simplify the equations that will be described below, the relationship of equation 19 will be used.

$$J = V_{be0}/(V_{CC} - V_{be0}) \quad (19)$$

It can therefore be shown that the relationship in equation 20 defines the current $I_X$ in terms of the Hall current $I_H$. It therefore follows that:

$$I_X = I_H + (1 - R_H J/R_1)(1 - (R_H J/R_1 V_{be0})(1 + J)\alpha \Delta T)/(1 - R_H J/R_1) \quad (20)$$

$$K \equiv 1 - R_H J/R_1 \quad (21)$$

$$S \equiv (R_H J(1+J)/R_1 V_{be0})(-\alpha)/(1-R_H J/R_1) \quad (22)$$

The relationship shown in equation 20 generally fits the required form illustrated by equations 21 and 22.

$$R_1/R_H = J(1-\alpha(1+J)/V_{be0}S) \quad (23)$$

The value for the resistance of resistor $R_1$ will cause the current $I_X$ to have a correct temperature coefficient and $V_X$ will track the Hall voltage $V_H$ over a relatively wide temperature range. Any temperature affects that may exist in resistor $R_{TRIM}$ can also be included.

Figure 5:
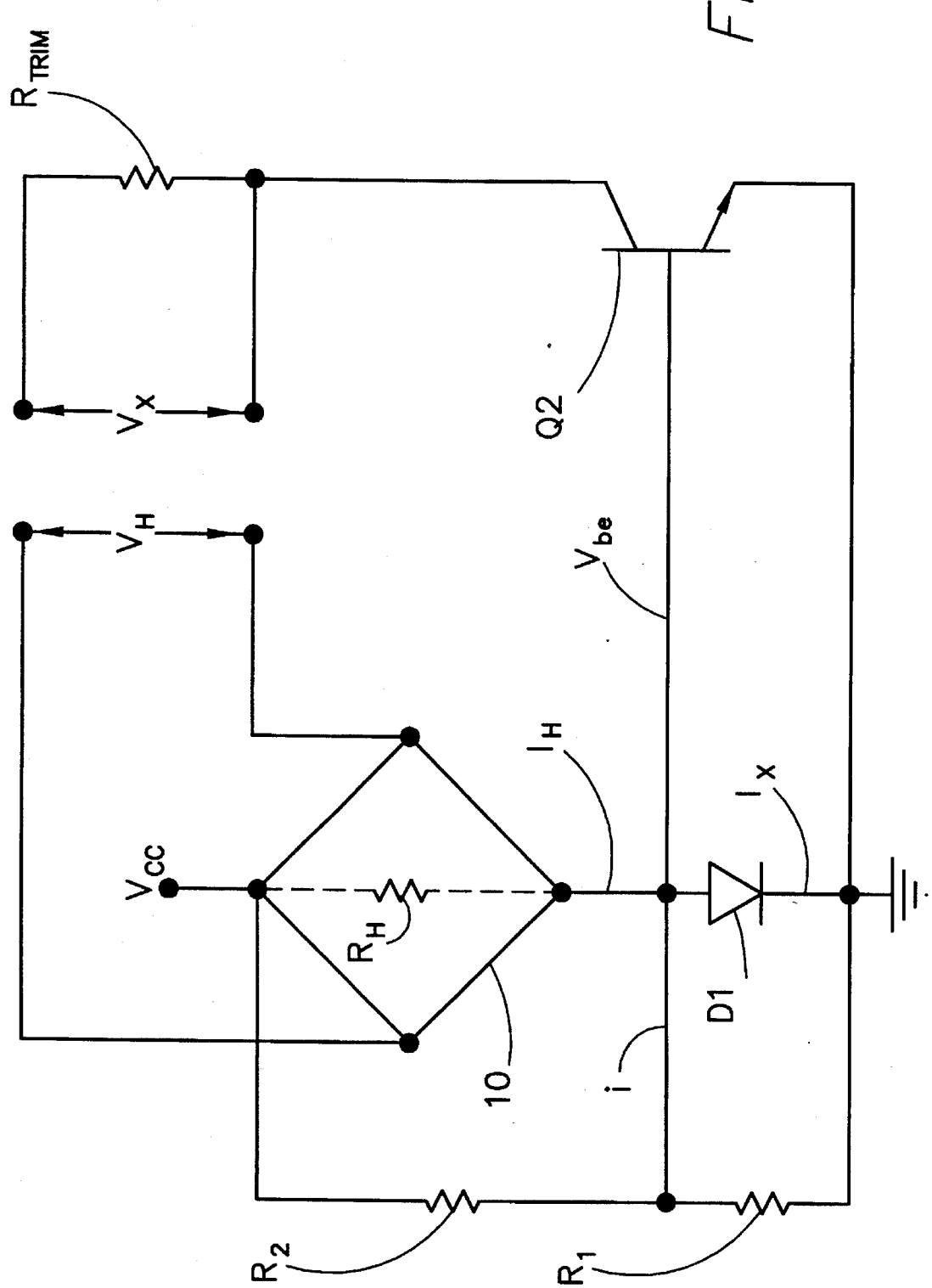
FIG. 5 shows another embodiment of the present invention.

FIG. 5 illustrates another embodiment of the present invention. It is generally similar to the embodiment shown in FIG. 4, but includes a second resistor $R_2$ that is connected in parallel with the Hall element 10 between the power source $V_{CC}$ and the anode of diode D1. If the relationship shown in equation 24 is maintained, the current flowing into the point between the Hall effect element 10 and the anode of diode D1, as represented by i in FIG. 5, will be zero when the temperature is equal to $T_0$, as defined in equations 24 and 25.

$$R_3/(R_2+R_3) = V_{be0}/V_{CC} \quad (24)$$

$$i = 0 \text{ at } T_0 \quad (25)$$

Through the use of Thevenin equivalents, the relationship in equation 26 can be shown where resistance $R_T$ is equal to the effective resistance provided by resistors $R_1$ and $R_2$.

$$i = (V_{be0} - V_{be})/R_T \quad (26)$$

$$R_T = R_1 // R_2 \quad (27)$$

Based on the relationship shown in equation 28, the relationship shown in equation 29 can be developed. It therefore follows that current $I_X$ can be defined by equation 30.

$$V_{be} = V_{be0} + \alpha \Delta T \quad (28)$$

$$I_X = I_H + (V_{be0} - V_{be0} - \alpha \Delta T)/R_T \quad (29)$$

$$I_X = I_H - \alpha \Delta T/R_T \quad (30)$$

As a result, the relationship between current $I_X$ and the Hall current $I_H$ is defined by equation 31. This same relationship is generally described by equation 32. Since equations 33 and 34 can be defined, the relationship between the first and second resistors, $R_1$ and $R_2$, can be described by equations 35 and 36.

$$I_X/I_H = (1 - \alpha \Delta T R_H/R_T(V_{CC} - V_{be})) \quad (31)$$

$$I_X/I_H \approx (1 - R_H \alpha \Delta T/R_T(V_{CC} - V_{be0})) \quad (32)$$

$$K \equiv 1 \quad (33)$$

$$S \equiv R_H(-\alpha)/(R_H(V_{CC} - V_{be0})) \quad (34)$$

$$R_2/R_H = (-\alpha)(1+J)/(SV_{be0}) \quad (35)$$

$$R_1 = JR_2 \quad (36)$$

The two embodiments of the present invention described above are particularly useful for magnetically sensitive circuits that comprise Hall cells.

Figure 6:
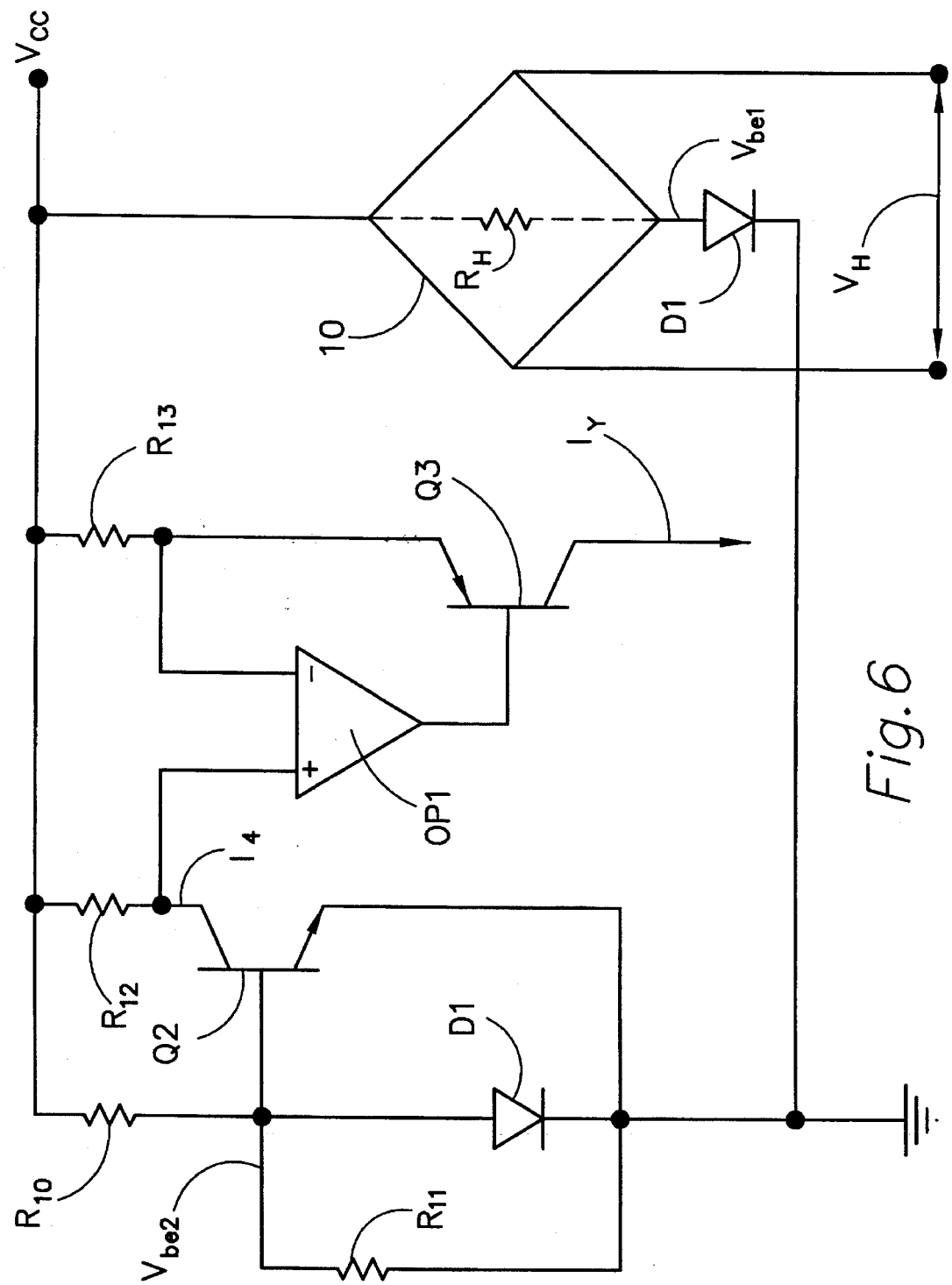
FIG. 6 shows yet another embodiment of the present invention.

With reference to FIG. 6, the relationship shown in equation 37 exists. Therefore, if resistor $R_{13}$ is made of the same material as the Hall cell and resistors $R_{10}$, $R_{11}$ and $R_{12}$ are all made of the same material, it can be shown that current $I_4$ is defined by equation 38 and current $I_Y$ is defined by equation 39.

$$V_H = ((V_{CC} - V_{be1})/R_H)(K_1 K_2 B_N(1+\alpha \Delta T)) \quad (37)$$

$$I_4 = (V_{CC} R_{11} - V_{be2}(R_{10}+R_{11}))/R_{10} R_{11} \quad (38)$$

$$I_Y = I_4 R_{12}/R_{13} \quad (39)$$

If the resistance of resistor $R_{13}$ is determined as shown in equation 40, the relationship shown in equation 41 is true.

$$R_{13} = K_6 R_H \quad (40)$$

$$I_Y = (R_{12}/R_{10}K_6)((V_{CC}-V_{be2})/R_H))(1-R_{10}V_{be2}/(R_{11}(V_{CC}-V_{be2}))) \quad (41)$$

$$R_{10}/R_{11} = J(1-\alpha(1+J)/SV_{be02}) \quad (42)$$

Equation 41 is the required form described above and is generally similar to the method described above in conjunction with the embodiment of the present invention illustrated in FIG. 4. However, the scale factor in equation 41 is slightly different than that described above. It can therefore be stated that the relationship between resistor $R_{10}$ and $R_{11}$ is that identified by equation 42. This relationship between resistors $R_{10}$ and $R_{11}$ will provide the required temperature coefficient to current $I_X$ and it can therefore be used to provide a reference signal with which the Hall signal can be compared. The advantage of the embodiment of the present invention shown in FIG. 6 is that the current can be trimmed to a value which is accurate at 25 degrees centigrade and can therefore be used in current controlled networks.

Although the present invention has been described in specific detail to illustrate several preferred embodiments of the present invention, it should be understood that alternative embodiments are also within its scope. The present invention provides a reference signal that varies as a function of temperature in a manner that is generally identical to the temperature induced variations in the output of a Hall element. By providing a reference signal of this type, the Hall output signal can be compared to the reference signal without the relationship between those two signals being changed as a function of temperature.

The embodiments of the invention in which an exclusive property or right is claimed are defined as follows:

1. A magnetic sensing circuit, comprising:

a magnetically sensitive device;

first means, connected in electrical communication with said magnetically sensitive device, for providing an output signal that is representative of the strength of a magnetic field in a predetermined direction relative to said magnetically sensitive device;

second means for providing a reference signal;

means for comparing said output signal to said reference signal, said second providing means comprising a means for causing said reference signal to change as a function of temperature in a manner generally similar to the way that said output signal changes as a function of temperature; and a diode is connected in series with said magnetically sensitive device between a power source and a point of ground potential, said causing means comprising a first resistor connected in parallel with said diode.

2. The circuit of claim 1, wherein:

said causing means further comprises a second resistor connected in parallel with said magnetically sensitive device.

3. The circuit of claim 2, wherein:

said magnetically sensitive device comprises a Hall effect element.

4. The circuit of claim 2, wherein:

said causing means comprises a first transistor having its base connected to said diode with said diode being connected between said base and said point of ground potential.

5. The circuit of claim 4, wherein:

said first transistor is connected between a trimmable resistor and said point of ground potential.

6. The circuit of claim 5, further comprising:

an operational amplifier, a first input of said operational amplifier being connected to a circuit point between said trimmable resistor and said first transistor.

7. The circuit of claim 6, further comprising:

a temperature sensitive resistor connected between said power source and a second input of said operational amplifier.

8. The circuit of claim 7, further comprising:

a second transistor having its emitter connected to said temperature sensitive resistor, a collector of said second transistor providing said reference signal.

9. The circuit of claim 8, wherein:

said temperature sensitive resistor is selected to have a temperature sensitivity which is similar to the temperature sensitivity of said magnetically sensitive device.

10. The circuit of claim 1, wherein:

said reference signal is a reference current.

11. The circuit of claim 1, wherein:

said reference signal is a reference voltage.

12. A magnetic sensing circuit, comprising:

a magnetically sensitive device;

first means, connected in electrical communication with said magnetically sensitive device, for providing an output signal that is representative of the strength of a magnetic field in a predetermined direction relative to said magnetically sensitive device;

second means for providing a reference signal;

means for comparing said output signal to said reference signal, said second providing means comprising a means for causing said reference signal to change as a function of temperature in a manner generally similar to the way that said output signal changes as a function of temperature; and a diode is connected in series with said magnetically sensitive device between a power source and a point of ground potential, said causing means comprising a first resistor connected in parallel with said diode, said magnetically sensitive device comprising a Hall effect element.

13. The circuit of claim 12, wherein:

said causing means further comprising a second resistor connected in parallel with said magnetically sensitive device, said causing means comprising a first transistor having its base connected to said diode with said diode being connected between said base and said point of ground potential, said first transistor being connected between a trimmable resistor and said point of ground potential.

14. The circuit of claim 13, further comprising:

an operational amplifier, a first input of said operational amplifier being connected to a circuit point between said trimmable resistor and said first transistor;

a temperature sensitive resistor connected between said power source and a second input of said operational amplifier.

15. The circuit of claim 14, further comprising:

a second transistor having its emitter connected to said temperature sensitive resistor, a collector of said second transistor providing said reference signal, said temperature sensitive resistor being selected to have a temperature sensitivity which is similar to the temperature sensitivity of said magnetically sensitive device.

16. A magnetic sensing circuit, comprising:

a magnetically sensitive device;

first means, connected in electrical communication with said magnetically sensitive device, for providing an output signal that is representative of the strength of a magnetic field in a predetermined direction relative to said magnetically sensitive device;

second means for providing a reference signal;

means for comparing said output signal to said reference signal, said second providing means comprising a means for causing said reference signal to change as a function of temperature in a manner generally similar to the way that said output signal changes as a function of temperature;

a diode is connected in series with said magnetically sensitive device between a power source and a point of ground potential, said causing means comprising a first resistor connected in parallel with said diode, said causing means further comprising a second resistor connected in parallel with said magnetically sensitive device, said causing means comprising a first transistor having its base connected to said diode with said diode being connected between said base and said point of ground potential, said first transistor being connected between a trimmable resistor and said point of ground potential;

an operational amplifier, a first input of said operational amplifier being connected to a circuit point between said trimmable resistor and said first transistor;

a temperature sensitive resistor connected between said power source and a second input of said operational amplifier; and a second transistor having its emitter connected to said temperature sensitive resistor, a collector of said second transistor providing said reference signal, said temperature sensitive resistor being selected to have a temperature sensitivity which is similar to the temperature sensitivity of said magnetically sensitive device.

17. The circuit of claim 16, wherein:

said magnetically sensitive device comprises a Hall effect element.

\* \* \* \* \*